United States Patent [19]

Mann

[11] 4,064,352

[45] Dec. 20, 1977

[54] ELECTRON BEAM EVAPORATOR HAVING BEAM SPOT CONTROL

[75] Inventor: Joseph K. Mann, Palo Alto, Calif.

[73] Assignee: Varian Associates, Inc., Palo Alto, Calif.

[21] Appl. No.: 658,205

[22] Filed: Feb. 17, 1976

[51] Int. Cl.² .......................................... H01J 37/305
[52] U.S. Cl. ..................................................... 13/31
[58] Field of Search ........ 13/31; 219/121 EB, 121 EM

[56] References Cited

U.S. PATENT DOCUMENTS

| | | | |
|---|---|---|---|
| 3,390,222 | 6/1968 | Anderson | 13/31 |
| 3,420,977 | 1/1969 | Hanks et al. | 13/31 X |
| 3,896,258 | 7/1975 | Hanks | 13/31 |

*Primary Examiner*—R. N. Envall, Jr.
*Attorney, Agent, or Firm*—Stanley Z. Cole; Leon F. Herbert; Edward H. Berkowitz

[57] ABSTRACT

An electron beam evaporator employs an electron gun which projects a beam of electrons over an arcuate beam path to a crucible target for heating and evaporating the target material in use. The electron beam passes through the magnetic field supplied by a pair of pole pieces of a beam focus magnet which produces a main field transverse to the direction of the electrons to cause the beam to take the arcuate trajectory. Two pairs of auxiliary pole pieces project inwardly of the main pole pieces to provide a pair of beam focus lenses. One of the magnetic lenses is disposed on the inside of the beam path, whereas the other is disposed on the outside of the beam path to provide beam lateral focusing and defocusing lenses, respectively. The lenses are adjustable, preferably electromagnetically for controlling the beam spot size on the target crucible so that the evaporation characteristics can be optimized for a given beam power. In addition, the magnetic lenses are adjustable, preferably electromagnetically, for sweeping the position of the beam spot longitudinally and/or laterally of the crucible target.

9 Claims, 5 Drawing Figures

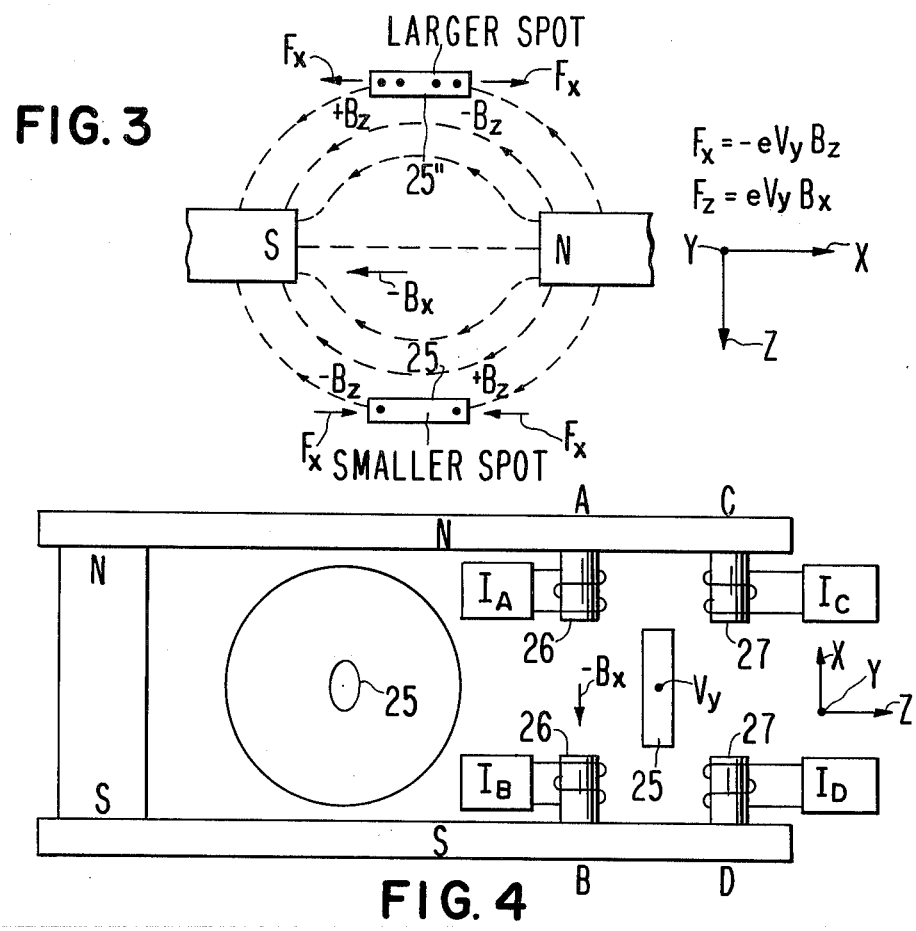
FIG. 3
FIG. 4
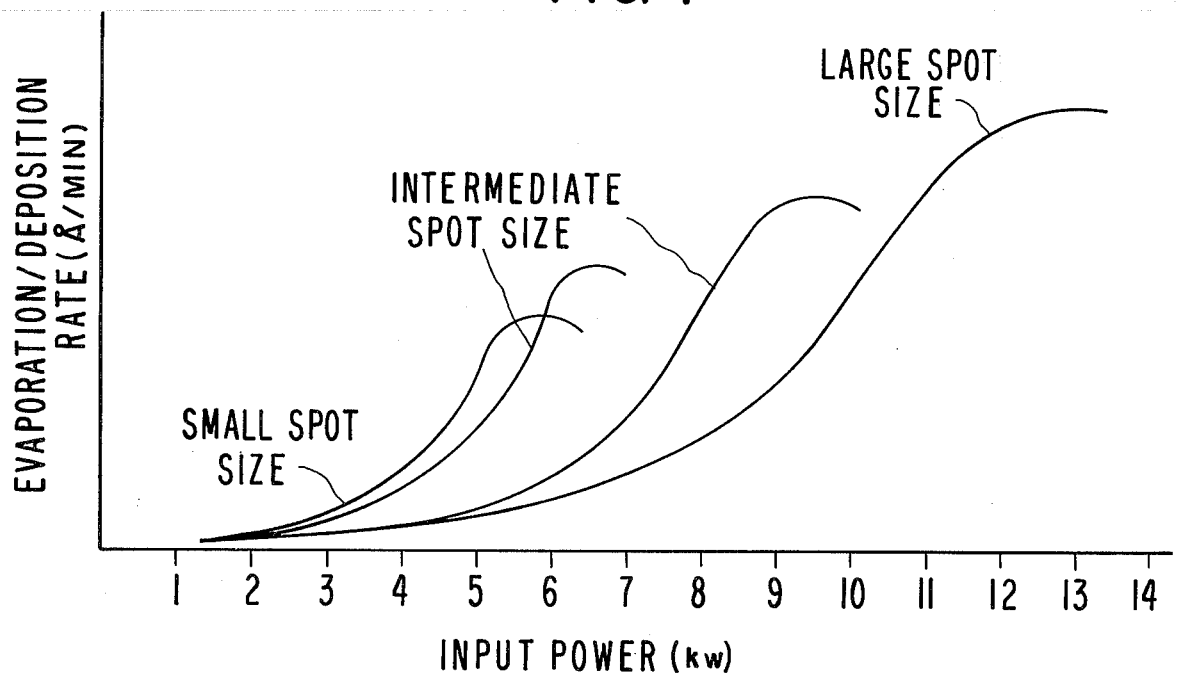
FIG. 5

ELECTRON BEAM EVAPORATOR HAVING BEAM SPOT CONTROL

BACKGROUND OF THE INVENTION

The present invention relates in general to electron beam evaporators and more particularly to such evaporators having beam spot control.

DESCRIPTION OF THE PRIOR ART

Heretofore, it has been proposed to employ one pair of auxiliarly pole piece structures projecting inwardly from a pair of main pole piece structures of an electron beam evaporator to provide a magnetic lens for adjusting or controlling the beam spot size at the crucible target. It was also suggested that the auxiliary pole piece structures take the form of magnetically permeable screws which would be axially translatable for adjusting the beam spot size. Such an electron beam evaporator structure is disclosed in U.S. Pat. No. 3,483,417 issued Dec. 9, 1969.

It is also known from the prior art to provide a pair of inwardly directed pole piece portions outside of the curved electron beam path for defocusing the electron beam and thus increasing its spot size to increase the rate of evaporation at the higher input powers to the electron gun. Distributing the electron beam energy over a greater area of the surface of the evaporant also minimizes the possibility of ejection of large particles of the evaporant materials, a common problem with sublimable evaporants such as Si, $SiO_2$, C, and the like.

It has also been proposed to electrically adjust the beam spot size at the target crucible by electrically controlling the saturation of a pair of magnetic shunts extending between the main pole piece structures one inside and one outside of the arcuate electron beam path for varying the focusing forces tending to decrease and to increase the spot size on the crucible target.

While the provision of the adjustable magnetic pole pieces on the inside of the electron beam path served to control the magnetic lateral focusing force tending to decrease the spot size of the beam at the target, it is desired to provide a greater control over the beam spot size and more particularly to impart an additional lateral defocusing force that can be preferably controlled or adjusted to derive a wider range of control or adjustment over the beam spot size. While the electromagnetic shunts operating on both the inside and the outside of the beam theoretically provide a wide latitude in the adjustment of the beam spot size, such shunts tend to substantially shunt the main magnetic field which requires the main magnetic to be larger than necessary to achieve the desired magnetic field for focusing of the electron beam. In addition if current were lost or interrupted to either of the shunting magnetic coils, the beam could be misdirected or focused onto more fragile elements within the evaporator causing severe damage thereto.

In addition, prior art systems have included an electromagnet for varying the intensity and shape of the main magnetic field in the region of the electron stream to produce a sweep of the beam spot over the target area. Sweeping the beam spot over the target area, known in the art as "dithering", allows a larger amount of target material to be utilized and is especially useful for sublimable evaporants.

Examples of prior art electron beam heating and/or evaporating devices employing magnetic means for sweeping the beam spot over the target area are disclosed in U.S. Pat. No. 3,235,647 issued Feb. 15, 1966 and U.S. Pat. No. 3,446,934 issued May 27, 1969.

In another prior art device, the beam sweep structure, for sweeping the beam both laterally and longitudinally of the crucible, included a generally U-shaped magnetic core structure with the electon beam being generally centrally disposed of the U-shaped magnetic structure. A magnetic gap was provided between the two side legs of the U-shaped structure and the parallel faces of the adjacent pole pieces of the main transverse beam focus permanent magnet. Coils were wound on the two legs and on the interconnecting member served to increase or decrease the magnetic field in the gap, thereby sweeping the beam spot longitudinally of the crucible. Separately energizing either of the side leg portions relative to the other produced a skewing of the total transverse field in the region of the beam from one direction to the other, thereby providing lateral sweeping of the beam spot over the target crucible.

While these aforecited prior art systems are suitable for sweeping the beam spot across the target area they are relatively bulky and complex.

SUMMARY OF THE PRESENT INVENTION

The principal object of the present invention is the provision of an electron beam evaporator having improved beam spot size and/or sweep control.

In one feature of the present invention, first and second pairs of auxiliary pole piece portions project inwardly from the main beam focus magnetic pole piece structure in the region of the beam path to provide a pair of beam spot lenses for beam spot size conrol and/or for varying the beam spot position relative to the target.

In another feature of the present invention, means are provided for adjusting the intensity and direction of the localized magnetic focusing forces on the electron beam as produced by either or both of the auxiliary pairs of pole piece structures.

In another feature of the pesent invention, the localized forces produced by either or both pairs of auxiliary pole piece structures on the beam is varied by means of varying the current through the electrical coil means magnetically coupled to one or more of the auxiliary pole piece portions for varying the magnetic flux passing through the auxiliary pole piece portion or portions, thereby facilitating control of the beam spot at the target crucible.

Other features and advantages of the present invention will become apparent upon a perusal of the following specification taken in connection with the accompanying drawings wherein:

BRIEF DESCRIPTION OF THE DRAWINGS

FIG. 3 is a schematic sectional view of a portion of the structure of FIG. 1 taken along line 3—3 in the direction of the arrows and showing the focusing and defocusing forces on an electron stream produced by a magnetic lens, FIG. 4 is a simplified schematic line diagram of a top view of an evaporator, and FIG. 5 is a plot of evaporation/deposition rate in angstroms per minute versus input power in kilowatts to the electron beam evaportor as a function of the beam spot size at the target crucible.

DESCRIPTION OF THE PREFERRED EMBODIMENTS

Figure 1:
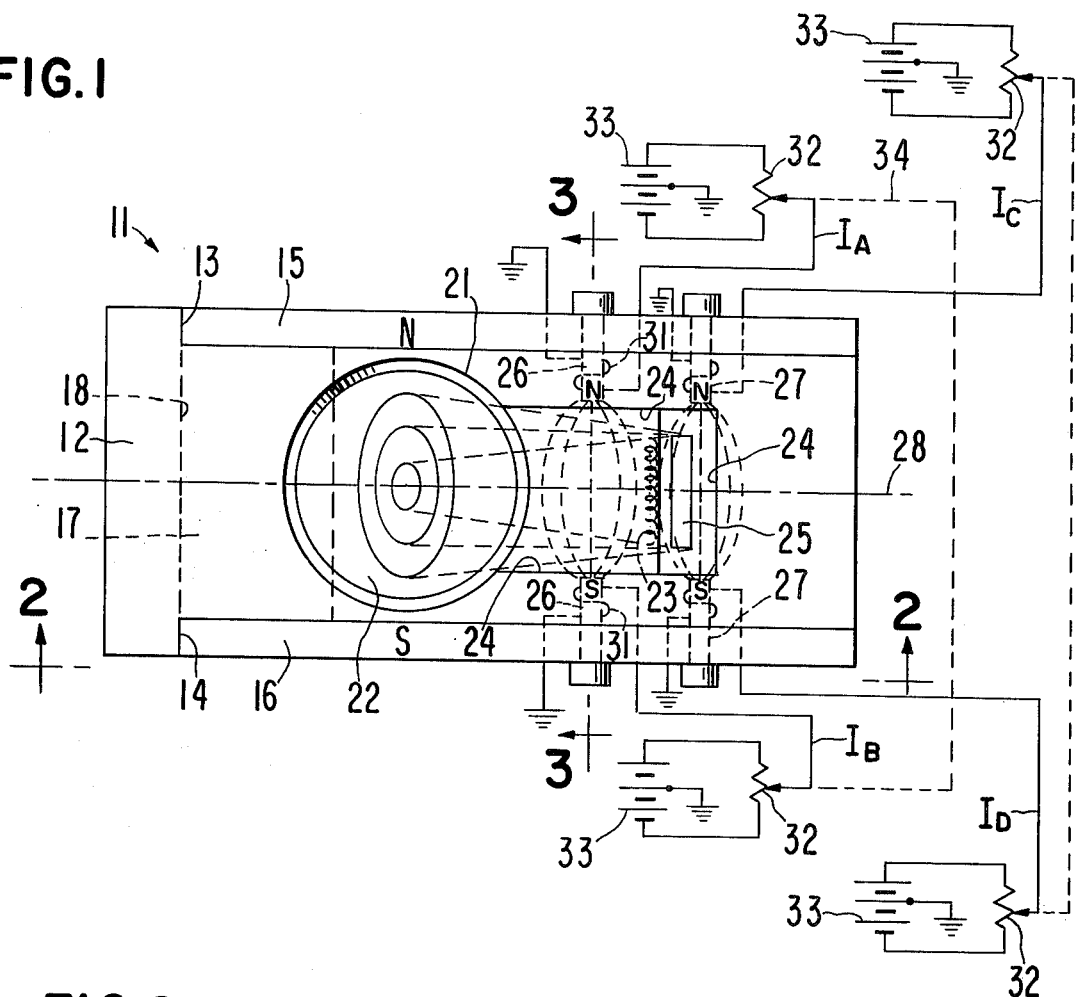
FIG. 1 is a top elevational view, partly in schematic form, of an electron beam evaporator incorporating features of the present invention.
Figure 2:
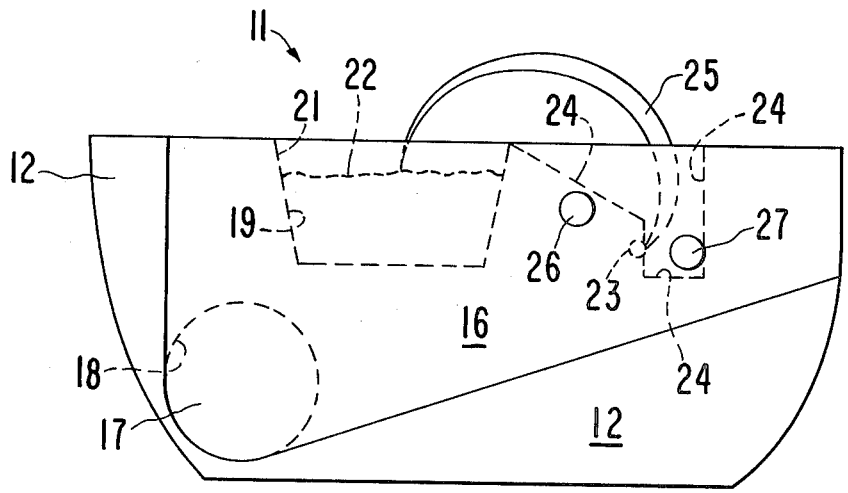
FIG. 2 is a side elevational view of the structure of FIG. 1 taken along line 2—2 in the direction of the arrows.

Referring now to FIGS. 1 and 2 there is shown an electron beam evaporator 11 having features of the present invention. The electron beam evaporator 11 includes a solid block 12 of thermally conductive metallic material, as of copper. The opposite sides of the conductive block 12 are recessed at 13 and 14 to receive magnetic pole piece structures or plates 15 and 16, as of magnetic alloy permeable or ferromagnetic material. The pole piece structures 15 and 16 are energized with magnetic flux by means of a transversely directed permanent magnet 17 interconnecting the pole pieces 15 and 16 and passing through a transverse bore 18 in the copper block 12.

A conical recess 19 in the upper side of the copper block 12 serves as a crucible 21 for containing a material 22 to be evaporated. Water coolant channels, not shown, course through the copper block for cooling same in use.

A thermionic directly heated filamentary cathode emitter 23 is contained in the block body structure 12 and the block is recessed at 24 to hold an acclerating anode structure not shown. The anode, located in close proximity to cathode 23 is operated at ground potential and which cooperated with a high negative potential, as of $-6$ to $-14$ kV, applied to the filamentary cathode 23 for projecting a ribbon shaped beam of electrons 25 from the cathode 23 through the recess 24 and into an arcuate beam path to the crucible 21. The electrical potential applied between the filamentary cathode 23 and the recessed walls 24 of the body and anode, in cooperation with a strong transverse magnetic field produced between the planar pole structures 15 and 16 causes the beam 25 to take the arcuate path to the crucible. In addition, the fringing magnetic field over the top surface of the block 12 has a certain curvature while facilitates lateral focusing of the electron beam 25 into the crucible 21.

The beam focus magnetic structures includes two pairs of auxiliary pole piece portions 26 and 27, respectively. Pole piece portions 26 comprise, for example, magnetically permeable posts axially aligned on opposite sides of the beam 25 and projecting toward a midplane 28 between the poles 15 and 16, such midplane 28 also being the midplane of the arcuate beam path. In a typical example, the magnetically permable posts 26 are conveniently formed by cap screws, as of cold-rolled steel threaded through tapped bores in the pole pieces 15 and 16. Each pair of pole piece portions 26 and 27 need not be physically separate members but each pair may comprise merely a single magnetically permeable member having a slot or high reluctance gap extending laterally of the member at about its midpoint and corresponding with the center plane 28, so as not to unduly shunt the magnetic flux supplied by the permanent magnet 17.

The first pair of auxiliary pole piece portions 26 are positioned at the upstream end of the beam and inside of the beam path, i.e., on the side of the beam path toward which the arcuate beam is curving. The auxiliary magnetic pole pieces 26 tend to outwardly bow the flux of the main field in a localized region around the high reluctance gap between their inner end portions in the region through which the electron beam 25 passes. Thus, the first set of pole piece portions 26 produce a magnetic beam focusing lens with the beam rising in the $y$ direction through the bowed magnetic field lines as indicated by beam 25 of FIG. 3. More particularly, the beam focus force on the electron beam 25 has two components an $F_x$ component tending to either increase or decrease the lateral size of the beam spot and an $F_z$ component which causes the beam to bend into its arcuate path to the crucible. The lateral focusing forces, i.e., the $F_x$ forces, are produced by the $B_z$ components of the magnetic field produced by the curvature (bowing) of the field lines; whereas the main curvature force on the beam is prouded by the transverse main beam focus magnetic field component $B_x$ which is in the $-x$ direction. This causes the main curvature force to be in the $-z$ direction, i.e., toward the crucible.

Now with regard to the lateral focusing forces which tend to either increase or decrease the spot size, i.e., the $F_x$ forces on beam cross-section 25, there is found to be a $+B$ component at the right end of the beam cross-section 25, there is found to be a $-B$ component at the left end of the beam cross-section 25 such that an inwardly directed force $F_x$ is produced at the left end and an inwardly directed force is also produced on the right end. Thus, the beam is focused to a smaller spot size at the crucible.

On the other hand, when the beam cross-section 25' is in the downstream position relative to the inwardly directed pole pieces, as encountered between pole piece portions 27, there is a $-B_z$ component on the right end of the cross-section 25' of the beam and a $+B_z$ component on the left end of the beam cross-section 25' so that outwardly directed defocusing forces $F_x$ are produced on opposite ends of the beam cross-section 25' to defocus the beam spot to a larger spot at the crucible. Thus, the pole piece portions 26 serve to focus the beam spot to a smaller spot size whereas the other pair of pole piece portions 27 serve to focus the beam spot to a larger spot size in the crucible. Relative strengths of the focusing and defocusing forces on the beam spot are adjustable by adjusting the axial gap between the ends of the screws 26 and 27.

Alternatively, and in a preferred embodiment, electrically energizable coils 31 are wound on each of the poles 26. The coils 31 are separately energized via a reversible current derived for example from a potentiometer 32 as connected across a center taped battery 33. In a convenient embodiment, the potentiometer outputs for both poles of the pair are ganged together by means of a mechanical linkage 34 controlled from a front panel knob. In addition, each of the potentiometer settings is independently adjustable for trimming of the focusing forces. By varying the DC energization of the coils 31, the amount of flux passing through each of the poles 26 is adjustable, thereby adjusting the strength and curvature of the field produced between the poles 26. In a similar matter, the field between the outside auxiliary poles 27 may be varied by coupling electrical coils thereto in the manner as described with regard to the poles 26.

In a preferred mode of operation (see FIG. 4 and Table I), the poles 26 and 27 are initially adjusted geometrically without current energization of coils 31 to introduce a net medium defocusing magnetic force tending to produce a medium spot size in the crucible 21.

Tables I and II summarize the relative magnitudes and polarities for the currents indicated in FIG. 4, for controlling spot size and beam steering respectively. In Table I and II, and in FIG. 4, currents greater than 0 mean that the windings through which that particular current flows are such as to produce a component of magnetic field which aids the $-B_z$ component produced by the main transverse magnetic field magnet structure in the region of the beam 25. Conversely, when the currents are indicated as being less than zero they are in a direction through the respective coils so as to produce a magnetic field component which tends to buck the main transverse magnetic field component $-B_x$.

In Table I means are disclosed for controlling spot size of the electron beam. With all current = 0, a medium size centered spot results (Table I, 1). When currents in coils 31 surrounding auxiliary poles 26 are greater than 0 and the currents in cils 31 surrounding poles 27 are less than 0 the strength of the main magnetic field, $-B_x$ remains nominally unchanged in the region of the beam, thus leaving unchanged the locus of the beam upon the evaporant surface, while achieving a desired curvature of the magnetic field in the manner shown by FIG. 3 and focussing the beam to a smaller spot (Table I, 2). In like manner, a defocussing condition resulting in a larger spot is achieved under the condition given by entry 3 (Table I).

TABLE I

| SPOT SIZE CONTROL | |
|---|---|
| CURRENT | SPOT SIZE |
| 1  $I_A = I_B = I_C = I_D = 0$ | Medium size spot |
| 2  $I_A = I_B > 0$ (increased magnetic field)  $I_C = I_D < 0$ (decreased magnetic field) | |
| 3  $I_A = I_B < 0$  $I_C = I_D > 0$ | Larger(st) spot |

Referring now to FIG. 5 there is shown a plot of evaporation or deposition rate in angstroms per minute versus input power in kilowatts to the electron gun as a function of beam spot size in the crucible 21. More particularly, from the plot it is seen that a maximum evaporation or deposition rate at an input beam power of approximately 6 kilowatts is obtained with a small beam spot size. However, with input beam power of 13 kilowatts, the optimum evaporation or deposition rate occurs for a large spot size. For intermediate input beam powers, intermediate spot sizes yield optimum evaporation or deposition rate. Thus, an advantage of the electron beam evaporator of the present invention is that it readily permits adjustment of the beam spot size in the crucible to yield optimum evaporation or deposition rate for a given input power to the electron gun.

It turns out that the magnetic pole portions 26 and 27, which have been previously described herein for the purpose of controlling the beam spot size, may also be used for sweeping the beam spot 25 laterally and longitudinally over the surface of the crucible. More particularly, the beam 25 may be swept in the longitudinal direction by increasing the current through each of the coils in the magnetic field aiding direction, i.e., $-B_x$, and this will produce an increased transverse magnetic field causing the beam to have increased curvature and to therefore move in the $+z$ direction in the crucible. Likewise if all the currents $I_A$, $I_B$, $I_C$ and $I_D$ are equal but less than zero, i.e., produce bucking magnetic fields bucking the $-B_x$ component the transverse magnetic field will be weakened thereby increasing the radius of curvature of the beam 25 and moving the beam spot 25 in the crucible in the $-z$ direction. The beam may be swept laterally by causing the currents $I_A$ and $I_D$ to equal and and aiding to the $-B_x$ transverse main field while $I_B$ and $I_C$ are energized to buck $-B_x$ to produce a skewing of the field causing the beam spot to move in the $-x$ direction. Similarly, causing the currents $I_B$ and $I_C$ to be greater than zero, while $I_A$ and $I_D$ are less than zero, skews the tranverse magnetic field $-B_x$ in the opposite direction to cause a lateral deflection of the beam spot 25 in the crucible in the possible $x$ direction. The conditions for longitudinal and lateral sweeping are shown in the lateral sweep Table II below.

TABLE II

| BEAM SPOT SWEEP | |
|---|---|
| 1  $I_A = I_B = I_C = I_D > 0$  $+F_z$ | Stronger field Longitudinal movement of the spot in $+z$ direction |
| 2  $I_A = I_B = I_C = I_D < 0$  $F_z$ | Weaker field longitudinal movement in $-z$ direction |
| 3  $I_A = I_D > 0$  $I_B = I_C < 0$  $-F_x$ | Lateral deflection in the $-x$ direction |
| 4  $I_A = I_D < 0$  4  $I_B = I_C > 0$  $F_x$ | Lateral deflection in the $+x$ direction |

One of the advantages of the structure of FIGS. 1 and 4 is that the same structure may be utilized both for controlling the beam spot size and for sweeping or moving the spot within the crucible. Thus, by superposition of the proper currents through each of the respective coils or by adjustment of the gap between the respective pole pieces any desired beam spot size and position in the crucible is attainable. By using the electromagnetic version of FIG. 4 all the adjustments can be made electrically from the outside of the bell jar or other chamber in which the evaporator or heater is located, and such adjustment may be effected at rapid periodic rates by electronic means.

With all coil currents = 0, the beam is characterized by a nominal size and centered in the crucible as determined by the magnetic field supplied by the permanent magnet. Failure of any kind resulting in loss of coil currents will therefore cause the beam to revert to this condition because such failure leaves the main field, $-B_x$, unchanged and will therefore not permit displacement of the beam so as to impinge articles being coated or portions of the apparatus with consequent damage, in contrast to prior art apparatus.

It is also apparent that other combinations of coil currents and auxilliary pole placement and designs could be directed to the ends above described. For example, a particular pole piece design and choice of currents could be so chosen as to accomplish all of the features described above wherein the individual coil currents would be characterized by relative magnitudes, having in common the same polarity, thereby achieving significant economy in power supply requirements.

What is claimed is:
1. In an electron beam heater:
   electron gun means for foming and projecting a beam of electrons over a selectable arucate beam path to a target material for heating thereof;
   magnetic beam steering and focusing means having a pair of main pole piece structures on opposite sides of the arcuate beam path for producing a beam focusing main magnetic field having a substantial vector component at right angles to a midplane between the pole piece structures and containing the arcuate beam path to produce bending of the beam into the arcuate beam path; and said magnetic beam steering and focusing means including, a first pair of auxiliary pole piece portions extending toward each other from said main pole piece structure and from opposite sides of said midplane so as to produce a localized magnetic lens to provide a force on the beam generally in the region of the gap between the inner free ends of said first auxiliary pole piece portions for control of the beam spot at the target, and a second pair of auxiliary pole piece portions extending toward each other from said main pole piece structure on opposite sides of said midplane of the arcuate beam so as to produce a second localized magnetic lens to provide a second force on said beam generally in the region of the gap between the inner free ends of said second auxiliary pole piece portions for control of the beam spot at the target.

2. The apparatus of claim 1 including, means for varying the intensity of the localized magnetic force produced on the electron beam by at least one of said pair of auxiliary pole piece portions for varying the position and shape of the beam spot at the target.

3. The apparatus of claim 2 wherein said means for varying the intensity of the localized magnetic force produced on the beam by said pair of auxiliary pole piece portions includes an electrical coil coupled to each said auxiliary pole piece portion for varying the magnetic flux passing through each said auxiliary pole piece portion.

4. The apparatus of Claim 1 wherein said pair of main pole piece structures includes a pair of magnetically permeable plates disposed on opposite sides of said arcuate beam path, and wherein at least one of said pair of auxiliary pole piece portions includes a pair of magnetic posts extending toward each other from said main pole piece plates.

5. The apparatus of claim 4 including an electrical winding wound on each of said magnetic posts, and electrical circuit means for energizing each said coil for varying the position and shape of the beam spot at the target.

6. The apparatus of claim 1 wherein one of said pairs of pole piece portions is disposed on the inside of said arcuate beam path and said other pair of pole piece portions is disposed outside of said arcuate beam path.

7. The apparatus of claim 6 including electrical coil means electromagnetically coupled to each of said pole piece portions for magnetically energizing each of said pole piece portions for effecting changes in the localized magnetic force on said beam to vary the position and shape of the beam spot at the target.

8. In an electron beam heating apparatus:

electron gun means for forming and projecting a beam of electrons over a selectable arcuate beam path to a target material for heating thereof;

magnetic beam focus means having a pair of main pole piece structures on opposite sides of the arcuate beam path for producing a beam focusing main magnetic field having a substantial vector component at right angles to a midplane between the pole piece structure to produce bending of the beam into the arcuate beam path;

a main source of magnetomotive force is magnetically coupled between said pair of pole piece structures for energizing said main pole piece structures with magnetic potentials of opposite sign; and sweeping means operatively associated with said magnetic beam focus means for sweeping the beam spot over the target material, said sweeping means including an auxiliary magnetically permeable magnetically coupled between said pair of main pole piece structures and having a pair of pole piece portions extending from opposite main pole piece structures toward each other and toward said midplane with a high magnetic reluctance region between their inner regions adjacent said midplane, electrical coil means magnetically coupled to said auxiliary magnetically permeable means for energizing said auxiliary magnetic pole piece portions in magnetic flux bucking relation so that the outer opposite ends of said pole piece portion adjacent opposite poles of said pair of main pole pieces are energized with component magnetic poles of like sign and the inner central region is energized with magnetic potential of opposite sign to that of the ends, whereby the main beam focus transverse magnetic field is skewed to produce lateral deflection of the beam spot on the target.

9. In an electron beam heating apparatus:

electron gun means for forming and projecting a beam of electrons over a selectable arcuate beam path to a target material for heating thereof;

magnetic beam focusing means having a pair of main pole piece structures on opposite sides of the arcuate beam path for producing a beam focusing main magnetic field having a substantial vector component at right angles to a midplane between the pole piece structures to produce bending of the beam into the arcuate beam path;

a main source of magnetomotive force magnetically coupled between said pair of main pole piece structures for energizing said main pole piece structures with magnetic potentials of opposite sign;

sweeping means operatively associated with said magnetic beam focus means for sweeping the beam spot over the target material, said sweeping means including an auxiliary magentically permeable means magnetically coupled between said pair of main pole piece structures and having a pair of pole piece portions extending from opposite main pole piece structures toward each other and toward said midplane with a high magnetic reluctance region between their inner regions adjacent said midplane, electrical coil means magnetically coupled to said auxiliary magnetically permeable means for energizing said auxiliary magnetic pole piece portions so that the opposite outer ends of said auxiliary magnetic means adjacent opposite poles of said pair of main pole pieces are energized with component magnetic poles of opposite sign, whereby the main beam focus transverse magnetic field is varied in intensity to produce longitudinal deflection of the beam spot on the target.

* * * * *

UNITED STATES PATENT AND TRADEMARK OFFICE
CERTIFICATE OF CORRECTION

PATENT NO. : 4,064,352
DATED : December 20, 1977
INVENTOR(S) : Joseph K. Mann

It is certified that error appears in the above—identified patent and that said Letters Patent are hereby corrected as shown below:

Col. 1, line 22, "auxiliarly" should be -- auxiliary -- ; Col.1 line 52, "magnetic" should be -- magnet -- ; Col. 2, line 13, There should be a period after "member" and "Energizing the coil on the interconnecting member" should be inserted before -- served -- ; Col. 3, line 3, "evaportor" should be -- evaporator -- ; Col. 3, line 31, "cooperated" should be -- cooperates -- ; Col. 3, line 45, "structures" should be -- structure -- ; Col. 4, line 15, "proudced" should be -- produced -- ; Col. 4, line 49, "taped" should be -- tapped -- ; Col. 5, line 18, "cils" should be -- coils -- ; Col. 6, line 1, "be" has been omitted after -- to -- ; Col. 6, TABLE II, "4" (representing the fourth equation) has been repeated; Col. 6, line 60, "foming" should be -- forming -- ; Col. 6, line 61, "arucate" should be -- arcuate -- ; Col. 8, line 3, delete "is" ; Col. 8, line 10, insert "means" after -- permeable -- ; Col. 8, line 47, "magentically" should be -- magnetically -- .

Signed and Sealed this

Twelfth Day of June 1979

[SEAL]

Attest:

RUTH C. MASON
Attesting Officer

DONALD W. BANNER
Commissioner of Patents and Trademarks